United States Patent [19]

Wallgren et al.

[11] Patent Number: 4,779,790
[45] Date of Patent: Oct. 25, 1988

[54] JOB ORIENTED METHOD AND APPARATUS UTILIZING MOLTEN SOLDER FOR PROCEDURES SUCH AS SOLDERING AND DESOLDERING

[75] Inventors: Linus E. Wallgren, Rockville; Ararat Amirian; William J. Siegel, both of Silver Spring, all of Md.

[73] Assignee: Pace Incorporated, Laurel, Md.

[21] Appl. No.: 940,409

[22] Filed: Dec. 11, 1986

Related U.S. Application Data

[63] Continuation-in-part of Ser. No. 763,704, Aug. 8, 1985, Pat. No. 4,659,002.

[51] Int. Cl.⁴ .................... B23K 29/00; B23K 31/02
[52] U.S. Cl. .................... 228/180.1; 228/191; 228/219; 228/262; 228/264; 228/33; 228/36; 228/180.2; 222/595; 222/603
[58] Field of Search .............. 228/180.1, 33, 36, 39, 228/19, 219, 220, 56.1, 56.2, 180.2, 256, 262, 191; 164/63, 66.1, 119, 120, 259, 306; 222/593, 595, 603

[56] References Cited

U.S. PATENT DOCUMENTS

| | | | |
|---|---|---|---|
| 3,318,370 | 5/1967 | Groteke et al. | 164/306 |
| 3,529,753 | 9/1970 | Mack | 164/306 |
| 3,599,831 | 8/1971 | Harvill et al. | 222/595 |
| 3,684,151 | 8/1972 | Burman et al. | 228/19 |
| 3,761,218 | 9/1973 | Portalier | 164/306 |
| 3,993,236 | 11/1976 | Antonevich | 228/56.2 |
| 4,474,322 | 10/1984 | Aldous | 228/180.1 |
| 4,527,608 | 7/1985 | Bak et al. | 164/306 |
| 4,659,002 | 4/1987 | Wallgren et al. | 228/56.1 |

FOREIGN PATENT DOCUMENTS

| | | | |
|---|---|---|---|
| 32488 | 10/1973 | Japan | 228/19 |
| 92298 | 7/1980 | Japan | 228/219 |
| 25863 | 2/1983 | Japan | 164/155 |
| 50169 | 3/1983 | Japan | 164/306 |
| 61158 | 4/1985 | Japan | 164/306 |
| 626880 | 9/1978 | U.S.S.R. | 164/306 |
| 899268 | 1/1982 | U.S.S.R. | 164/155 |

*Primary Examiner*—Nicholas P. Godici
*Assistant Examiner*—Samuel M. Heinrich
*Attorney, Agent, or Firm*—Gerald J. Ferguson, Jr.

[57] ABSTRACT

Apparatus for performing an operation with molten solder, such as soldering or desoldering a component mounted on a substrate such as a PCB including an enclosed reservoir, the reservoir including a contained space above the molten solder; a hollow nozzle for receiving solder from the reservoir; an element for conveying the molten solder in the reservoir to the nozzle; and a source connected to the contained space for introducing a pressurized gas into the space to raise the solder through the conveying means to a predetermined level within the nozzle and maintaining said solder at said predetermined level to thus effect the operation with the molten solder and then removing the gas to return the solder to the reservoir. The gas is pulsed at least during the time the solder approaches and reaches the predetermined level. The apparatus includes a plurality of different size hollow nozzles for receiving solder from the reservoir where the nozzles are removably attachable with respect to the reservoir. A unique solder reservoir configuration is also disclosed.

31 Claims, 5 Drawing Sheets

JOB ORIENTED METHOD AND APPARATUS UTILIZING MOLTEN SOLDER FOR PROCEDURES SUCH AS SOLDERING AND DESOLDERING

RELATED APPLICATION

The subject application is a continuation-in-part of U.S. Pat. No. 4,659,002 granted Apr. 21, 1987 based on U.S. application Ser. No. 763,704 filed Aug. 8, 1985 by Linus E. Wallgren, Robert Fridman, and William J. Siegel entitled "Apparatus for Replacement of Through-Hole Mounted PCB Components", the foregoing patent having been assigned to the assignee of the present application where the foregoing patent is hereby incorporated herein by reference.

FIELD OF THE INVENTION

This invention relates to a method and apparatus utilizing pneumatic pressure for raising molten solder to a working position to effect soldering/desoldering of components mounted on a PCB or the like to thus facilitate the insertion or removal of components therefrom, or to effect other operations.

BACKGROUND OF THE INVENTION

Various techniques are known for applying molten solder to a PCB having through-hole mounted components to effect soldering and/or desoldering operations. Of the known devices, they generally fall into two categories. The first consists of a solder bath where a container is provided for the molten solder and the solder simply sits in the container, there being no movement of the solder. The leads of the components to be removed are dipped into the bath to effect either soldering or desoldering thereof. This technique is unsatisfactory in that the entire surface area of the solder is exposed to the air and tends to be oxidized thus forming contaminants for the above operations. Further, other contaminants may be introduced into the upper surface of the bath due to the soldering and/or desoldering operations. In a relatively short time the dross (as the above contaminants are sometimes collectively called) must be removed in order not to compromise the soldering-/desoldering operations or other means must be used to accommodate this problem.

In another system, a fountain effect is provided whereby the solder is raised through a first path through an opening to form a fountain which contacts the area of the PCB to be processed, the solder then being returned to the main solder supply via a second path. Such a device is disclosed in U.S. Pat. No. 4,162,034. Such devices also involve a large exposure of the solder to the ambient air thus introducing a large degree of oxidation which ultimately shortens the useful life of the solder supply. Hence, the solder supply must be relatively frequently replaced in order not to compromise the integrity of the soldering/desoldering process.

Other prior art directed to the use of molten solder for soldering and desoldering operations includes U.S. Pat. Nos. 2,986,108; 3,990,621; 3,993,235; 4,315,590; 4,412,641; 4,437,605; and 4,523,708.

The soldering/desoldering device described in the above related application Ser. No. 763,704 is characterized in one aspect thereof in that the solder is raised to the upper surface of a hollow applicator having an open top. The mechanism employed for raising the solder is a piston and cylinder type arrangement. Although this arrangement is useful in certain applications, it does have a drawback in other applications such as soldering or desoldering. That is, when soldering or desoldering, the PCB is placed above the applicator and means are employed to hold it in place. However, since the solder is raised to the uppermost level within the applicator and since it is sometimes difficult to control the pressure exerted by the piston and cylinder arrangement, there is at times a tendency for the solder to break through the holes and flow onto the upper surface of the board. Moreover, the piston often tends to bind in this type of application.

In order to solve the foregoing problem one aspect of the present invention is to employ pneumatic means for raising the solder to the uppermost level of the applicator. Accordingly, the pressure can be very accurately controlled to prevent solder breaking through the holes of the PCB. Other prior art devices have employed pneumatic means in connection with soldering/desoldering utilizing molten solder such as the above mentioned U.S. Pat. No. 4,162,034. However, as stated above, the foregoing patent is directed to the formation of a fountain which flows against the area of the PCB to be processed. The disadvantages of this process in terms of contamination of the solder have been discussed above. This contamination problem is overcome in the above mentioned related application and in the present invention in that the surface area of the solder normally exposed to the atmosphere is quite small compared to the total service area of the solder employed in the system. Further, the solder is raised to the top of the applicator only when needed for a soldering/desoldering operation or other special operation. It is immediately lowered after the operation and thus, for this further reason, contamination of the solder is kept to a minimum. The latter system is known as a dynamic balance system in that the solder is dynamically balanced at the uppermost level of the nozzle during soldering/desoldering. This is in contradistinction to the static solder bath or the free flowing fountain types of systems. The use of pneumatic pressure in a dynamic balance system overcomes not only the problems associated with U.S. Pat. No. 4,162,034 but also those which are occasionally encountered in the system of the related application Ser. No. 764,704.

SUMMARY OF THE INVENTION

It is thus a primary object of the invention to provide in a dynamic balance system, pneumatic means for effecting the dynamic balance.

It is a further object of this invention to provide a pulsating pneumatic source whereby the rise of solder to the uppermost level of the applicator may be accurately controlled.

It is a further object of this invention to provide a pulsating pneumatic source whereby the solder may be automatically returned to the same level in the applicator each time a molten solder operation is performed.

It is a further object of the present invention to provide a pulsating pneumatic means in a dynamic balance system whereby small ripples or waves are formed at the upper surface of the solder in the nozzle to facilitate a soldering/desoldering operation due to agitation introduced by the above mentioned waves or ripples.

It is a further object of this invention to provide an improved applicator consisting of a removable nozzle having an open top.

It is a further object of this invention to provide a plurality of such removable nozzles for use in a desolder-solder system employing molten solder whereby components or connectors of different sizes and configurations mounted on a PCB may be readily accommodated.

It is a further object of this invention to provide an improved solder reservoir for use in a dynamic balance or fountain type system which is easily and economically manufactured and maintained.

It is a further object of this invention to provide apparatus for providing pulsed pneumatic means for a soldering/desoldering system employing molten slder.

It is a further object of this invention to provide improved electrical circuitry for controlling the above mentioned pulsed pneumatic means.

It is a further object of this invention to provide improved auxiliary heating sources for use with this invention, such sources being useful when the job to be performed is larger in size than the capacity of the deployed desoldering/soldering system.

Other objects and advantages of this invention will be apparent from a reading of the following specification and claims taken with the drawing.

DETAILED DESCRIPTION OF PREFERRED EMBODIMENTS OF THE INVENTION

Reference should be made to the drawing where like reference numerals refer to like elements and components of the invention.

Figure 1:
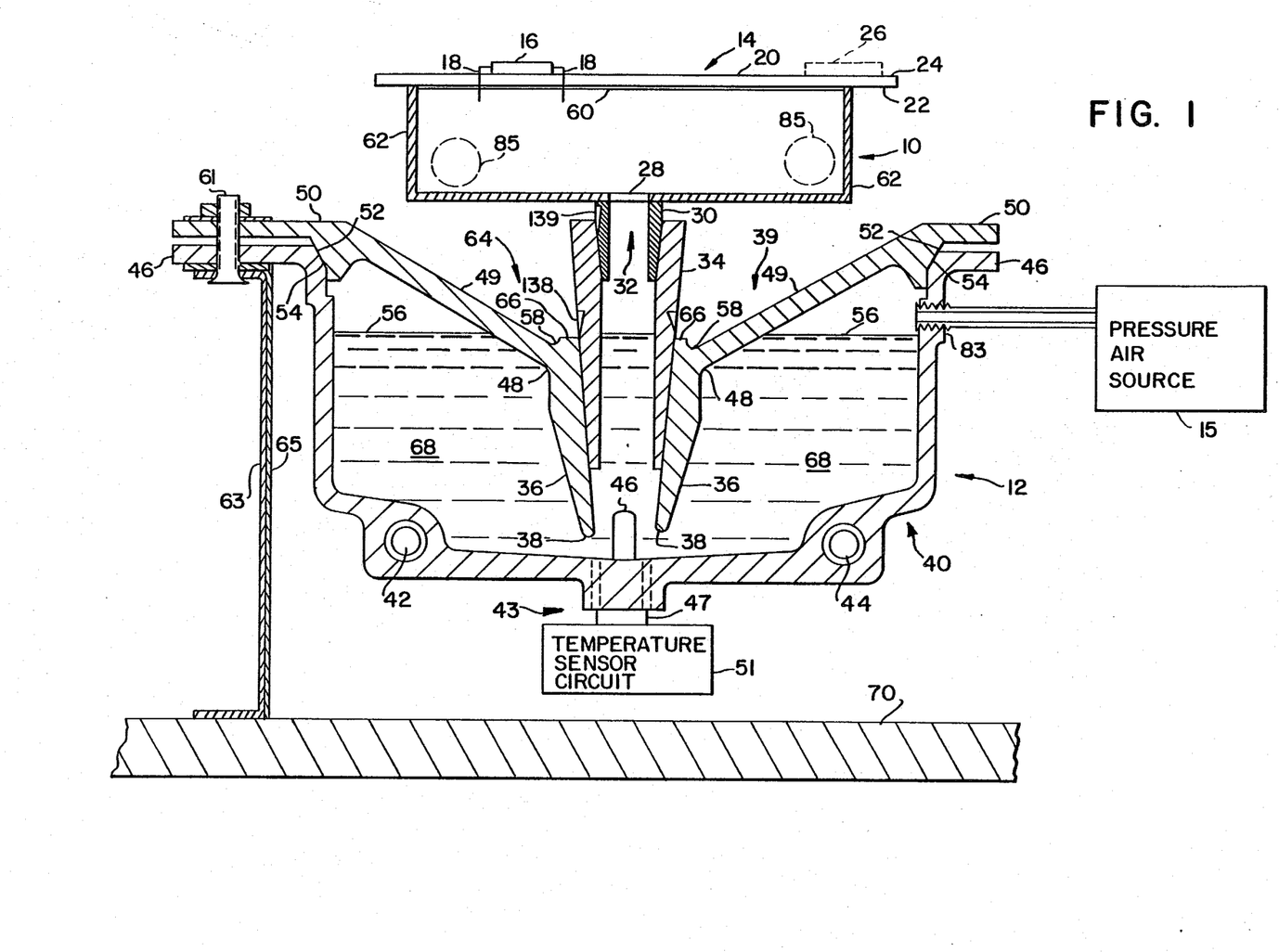
FIG. 1 is a cross-sectional view of an illustrative, job oriented, multilead soldering/desoldering apparatus for use with the present invention.

Referring to FIG. 1 there is illustrated a multi-lead desoldering/soldering system in accordance with the present invention generally including a nozzle 10, a solder reservoir 12, and a pressurized air source 15. As will be described in more detail hereinafter, the system of the present invention is job oriented—that is, solder is applied to a work 14 from reservoir 12 to nozzle 10 only during the time the work requires the solder for a desoldering or soldering operation. As can be seen in FIG. 1, the work 14 is positioned on the nozzle 10 where the work may comprise a substrate such as a printed circuit board (PCB) having mounted thereon a number of different type components and/or connectors where the components and/or connectors typically are mounted with through the board leads or pins. As can be seen in FIG. 1, component 16 has leads 18 which extend through holes (not shown) in the board 20, the leads being soldered at the surface 22 of the board to pads or connectors printed on surface 22 in a known manner. Although normally intended for use with components having through the board leads or pins, the invention may also be used with surface mounted devices (SMD's) where such devices would be mounted on the surface 24 of the board as indicated by the dotted line SMD 26, as will be further discussed below.

As will be described further below, the nozzle 10 may have a number of different configurations, either rectangular, circular, square, or other special configurations depending upon either the configuration of the device to be removed or installed or some special procedure to be performed. Typically, the nozzle has an open top and the walls thereof are made of a material such as stainless steel and very thin in order to minimize heat conductivity and heat capacity. Disposed in the bottom center portion of the nozzle is an opening 28. A tubular, tapered plug 30 is attached to the bottom of the nozzle, the opening 32 extending through the plug having a diameter preferably substantially the same as or exactly equal to the diameter of the opening 28 in the bottom of nozzle 10. The plug 30 is typically also made of stainless steel.

The plug 30 is removably insertable into an intermediate, tubular, tapered plug 34. This plug also may be made of a low heat conductivity, low thermal mass material such as stainless steel. Plug 34 is removably insertable into a tubular member 36 comprising a portion of a cover generally indicated at 39. Notches 138 are provided at the sides of intermediate plug 34 to facilitate the removal of plug 34 from tubular portion 36. Similar notches 139 are provided for plug 30. The inner opening of tubular portion 36 is inwardly tapered to receive the tapered portion of intermediate plug 34. Hence, it can be seen due to the outer tapers of plugs 30 and 34 mating with the inner tapers of plugs 34 and tubular portion 36, respectively, seals are formed between these respective members and thus the passageway 37 extending from the bottom 38 of tubular portion 36 to the lower opening 28 in plug 10 is sealed to solder flow. In some instances, the nozzle 30 can be so sized as to fit directly into tubular portion 36; however, use of intermediate plug 34 is preferred to provide separation from the heated reservoir 12 and the work 14, and to simplify the designs and manufacture of nozzle 10 and its associated plug 30.

The reservoir 12 includes basically two members comprising a molten solder container 40 and a cover 39 where both of these elements are typically made of cast iron or a material having similar thermal characteristics and capability of not contaminating the solder. Typically, the general shape of container 40 is cylindrical although it may be rectangular or any other configuration. Heating elements 42 and 44 may be disposed in the lower portion of the container to heat the solder to a temperature of about 300°–600° F. A temperature sensor generally indicated at 43 includes a probe 45, a connector 47, and a temperature sensor circuit 51. The temperature sensor may be employed on an open-loop basis to permit manual maintenance of the solder at a desired temperature or on a closed-loop basis to effect automatic temperature maintenance in a known manner.

The upper portion of container 40 is provided with a flange 46. The cover 39 for the reservoir includes a downwardly extending wall 49 which extends between the upper portion 48 of tubular member 36 to a flange portion 50 of the cover. The upper, interior surface of wall 49 is provided with a tapered surface 52 which mates with a tapered surface 54 provided on the interior surface of container 40 adjacent the flanged portion 46 thereof. Accordingly, the cover 39 may be fitted onto the container 40 and a hermetic seal will be provided between the tapered portions 52 and 54 due to the force fit therebetween. Other known means may also be employed to obtain a hermetic seal between the cover and container.

The force fit between tapered portions 52 and 54 may be effected by a plurality of (for example, four) bolts disposed around the periphery of cover 39 and extending through flanges 46 and 50, one of these bolts being indicated at 61. The bolts 61 also hold in place a respective plurality of U-shaped brackets 63, which suspend reservoir 12 above base 70, the inner surfaces of the brackets being covered with a thermal insulating material 65 to isolate them from the heated reservoir. Thermal insulating material (not shown) may also be packed about the reservoir for further thermal isolation of the reservoir.

The initial solder level in reservoir 12 is typically at level 56. As can be further seen, cover 39 covers most of the solder in the reservoir and, in particular, that beneath wall 49 is almost completely isolated from the atmosphere due to the hermetic seal established between tapered portions 52 and 54. Due to this isolation, it has been found that a build up of dross over a long period of time is kept to a minimum. Moreover, since dross such as oxides and the like tend to rise to the upper surface of the molten container, this dross, if any, will tend be at the surface 56. Since it is located at surface 56, it cannot contaminate soldering or desoldering operations performed by the system 10.

The lower portion 48 of wall 49 is provided with a groove 58 on the exterior surface thereof, the purpose of this groove being to capture any solder which accidentally or intentionally overflows nozzle 10. In most soldering/desoldering operations, it is preferable that the solder be brought to the uppermost level of nozzle 10 and maintained there, this level being indicated at 60 in FIG. 1. Normally, this level can be quickly established without overflow over the sides 62 of nozzle 10 into a cup 64 defined by the upwardly extending wall 49. However, there are instances when it may be desirable to remove a minor amount of dross which may accumulate at the upper surface of the solder when it is in its raised position at the uppermost level of nozzle 10. In these instances, it is possible under the control of pressurized air source 15 to overflow the solder including the dross therein into cup 64 where it accumulates in circular groove 58 disposed at the bottom of cup 64. The purpose of groove 58 is to permit the removal of removable plug 34 without allowing the contaminated solder in groove 58 to return to the solder in container 40 via the passageway through tapered, tubular member 36. Hence, the purity of the contained solder can be maintained at a high level for a long period of time. That is, even though some of the solder is removed from the system by overflowing it to remove dross, as described above, the amount of remaining solder is just as effective as the amount of original solder for soldering, desoldering and other operations. This remaining solder can also be quickly brought to the uppermost level of nozzle 10 under the control of source 15, as will be described below.

Tubular portion 36 includes a flat portion 66 disposed at the upper surface thereof inside groove 58, the flat portion contacting removable plug 34. When initially filling reservoir 12 with molten solder or when refilling the reservoir, flat portion 66 may act as a fill line. That is, with the nozzle 10 and plug 34 removed, an operator can easily visualize when the solder has risen within tubular portion 36 to a level corresponding to flat portion 66. Thus, the level of the solder within cavity 68 covered by wall 49 can readily be established with a high degree of accuracy at the level shown in FIG. 1. This level will permit long lasting, effectively contaminate free operation of the system before replacement of the molten solder is necessary.

As stated above, only the relatively small surface of the solder extending into passageway 37 is exposed to the atmosphere and thus contamination of the solder by oxidants and the like is held to a minimum. This is in contradistinction to the typical solder bath where the entirety of the upper surface of the bath is exposed to the atmosphere to continually contaminate the entire upper surface thereof and thus introduce significant problems relating to contamination of the soldering and/or desoldering procedures. Moreover, in the system of FIG. 1, any contaminants which do form at the upper surface of the solder extending into passageway 37 tend, with operation of the system (as the solder is raised to the uppermost level of the nozzle 10 for a job) to be deposited on the side wall of passageway 37 such that uncontaminated solder is presented to the job at the nozzle, and with further operation of the system (the solder is returned to level 56), the dross in passageway 37 passes downwardly and around the bottom end 38 of tubular portion 36 and into the solder located in the cavity 68 under wall 49. There the contaminants rise through the solder in cavities 68 to the upper surface of the solder in these cavities where they are no longer able to reach the working surface at the upper level of nozzle 10 and thus they are rendered ineffective as contaminants of the solder/desolder operation of the system.

As stated above, the configuration of nozzle 10 may assume various shapes depending upon the application. For example, the configuration of a nozzle may conform to the configuration of a component to be removed or inserted or it may be generally configured to permit insertion or removal of several components at the same time. Furthermore, the nozzle may have more than one opening at the top to respectively accomodate more than one component on the board. Moreover, compartments may be provided within the nozzle to restrict application of the solder in each compartment to a particular area of the job. In typical usage, it provides safe, fast removal and replacement for S.I.P. and D.I.P. packages, connectors and pin grid array (P.G.A.) packages. Further, the system may be used with PCB's having plated through holes, double sided multilayer or flexible. In particular, with respect to single and dual in line packages, the nozzle may be shaped to all known configurations. For pin grid arrays the nozzle configuration typically can handle a maximum size of at least 6 by 6 cm while for connectors it can handle a maximum size of at least ½ inch by 18 inches. A standard size nozzle may typically comprise a hollow, rectangular, parallelopiped with an open top which can solder/- desolder D.I.P. packages having up to 40 leads the nozzle being 3 inches long in the horizontal direction of FIG. 1 by 0.75 inches wide in the direction perpendicular to the plane of FIG. 1 and 0.7 inches deep in the vertical direction of FIG. 1. Another standard nozzle could have a square cross section for pin grid arrays, the nozzle being 2½ inches by 2½ inches by 0.7 inches deep. Other nozzle configurations which would have wide applicability would be those with the following rectangular cross sections—namely, (a) six inches long by 0.75 inches wide by 0.7 inches deep, (b) nine inches long by 0.75 inches wide by 0.7 inches deep, (c) twelve inches long by 0.75 inches wide by 0.7 inches deep, and (d) eighteen inches long by 0.75 inches wide by 0.7 inches deep. In some of the latter configurations, an auxiliary heater mechanism may be required due to the size thereof. Such mechanisms are described hereinafter with respect to FIGS. 5 and 6.

Figure 2:
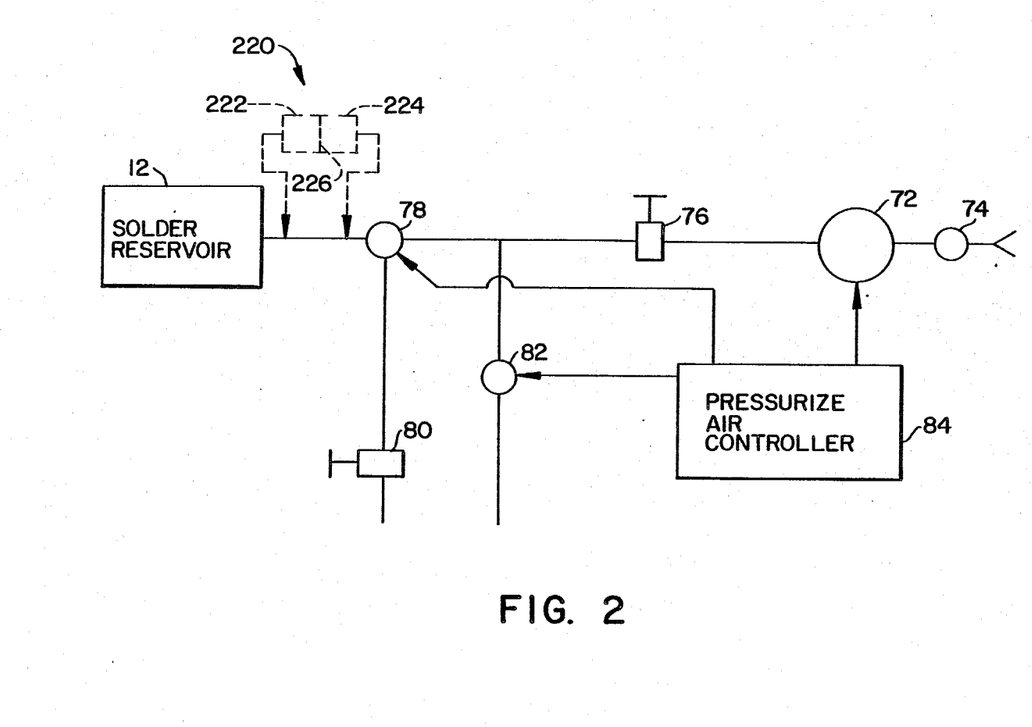
FIG. 2 is a schematic view of an illustrative pressurized air source for use with the system of FIG. 1.

Reference should now be made to FIG. 2 which shows in further detail pressurized air source 15 of FIG. 1. In particular, pressurized air source 15 includes an air pump 72 connected to the atmosphere or an inert gas container (not shown) via a filter 74. Pump 72 is connected to solder reservoir 12 via a needle valve 76 and a three way solenoid valve 78. In a first position, solenoid valve 78 connects pump 72 to solder reservoir 12. In this position, as can be seen in FIG. 1, the pressurized air delivered from pump 72 enters the confined space between cover 39 and the upper surface 56 of the solder and exerts a downward force on surface 56. Accordingly, the solder in passageway 37 rises, and as will be described in more detail hereinafter, continues to rise until it is typically at the uppermost level of nozzle 10. At this point the head of solder extending through passageway 37 into nozzle 10 is such as to correspond to the differential between the pressure being exerted on the surface 56 of the solder and atmospheric pressure. In a second position of solenoid valve 78, the reservoir 12 is vented to the atmosphere through a flow control valve 80. In this position of solenoid valve 78, the solder in nozzle 10 is allowed to return to its level shown in FIG. 1. This typically occurs after a soldering or desoldering operation. The purpose of flow control valve 80 is to control the release of air to the atmosphere so that the solder in nozzle 10 returns to the level of FIG. 1 at a relatively slow rate. Thus, solder joints formed in the plated through holes of board 20 maintain their integrity. If the solder were allowed to flow too quickly away from the joints formed within the holes, some of the solder would be drawn from the holes thus possibly severely compromising the integrity of the soldered joints. Moreover, if the solder is allowed to flow away too quickly there is a tendency for icicles of solder to form on the bottom of the board.

When solenoid valve 78 is in its second position, pump 72 is disconnected from the reservoir. Pump 72 is typically of the type where a predetermined amount of time (typically about 0.5 seconds) is required before the pump reaches its rated pumping speed. During this time, solenoid valve 78 will be in its second position and the pump will be vented to the atmosphere via a normally closed, two-way solenoid valve 82. As will be further described below, solenoid valve 82 may be pulsed on and off to raise the solder in nozzle 10 to typically the uppermost level of the nozzle and to maintain the solder at this level. Such a pulsed, solenoid valve is described in an article entitled "Simple Pneumatic Servo Valve is Pulse Width Modulated", Design News, Feb. 17, 1986, pages 164 through 166, a copy of the enclosed article being submitted herewith. The foregoing article is incorporated herein by reference. Needle valve 76 is typically preadjusted and provides coarse regulation for the rise of solder from its position shown in FIG. 1 to its final level within nozzle 10.

Pump 72 and solenoid valves 78 and 82 are under the control of a pressurized air controller 84, which will be described in further detail in FIG. 4.

The operation of the pressurized air source 15 of FIG. 2 will now be described referring to FIG. 3, which illustrates the timing for various cycles of operation which typically occur for either a soldering or desoldering operation of the system of FIG. 1. Referring to the first cycle, which corresponds to the start up of pump 72, it can be seen the electrical outputs from controller 84 are such that the pump is on, solenoid valve 82 is ON (or open) while solenoid valve 78 is OFF (that is, in its second position). Thus, until the pump reaches its rated speed, air is exhausted through solenoid valve 82. As stated above, this typically occurs in about 0.5 second.

Duing the next cycle of operation, the electrical outputs from pressurized air controller 84 are changed such that solenoid valve 82 is switched OFF (that is, it is closed) while solenoid valve 78 is switched ON (that is, switched to its first position). Pump 72 remains on and thus pressurized air is applied directly to reservoir 12 through needle valve 76 and valve 78 to raise the solder through passageway 37 into nozzle 10 at a relatively high rate of speed. This high rate of speed is desirable in many instances in that the solder tends to lose its heat as it is raised from the reservoir. Hence, if the rise occurs too slowly, the temperature of the solder may drop to a point where the soldering and/or desoldering operation is compromised. Thus, in aooordance with one aspect of the invention, the solder is initially raised at a high rate of speed until the solder reaches a predetermined percentage of its final, intended level. This percentage may vary depending upon the application; however, the percentage is typically at least 95 percent and preferably about 99 percent. As indicated in FIG. 2, the fast rise time may be adjusted any where from 0 to 9.9 seconds. Of course, if a longer rise time is desired, such a rise time is also within the scope of the present invention. The fast rise time is typically a function of the size of nozzle 10. Hence, a fast rise time of about 4 to 5 seconds is desirable with a nozzle 6 to 8 inches long, ¾ inches wide and 0.7 inches deep.

Figure 3:
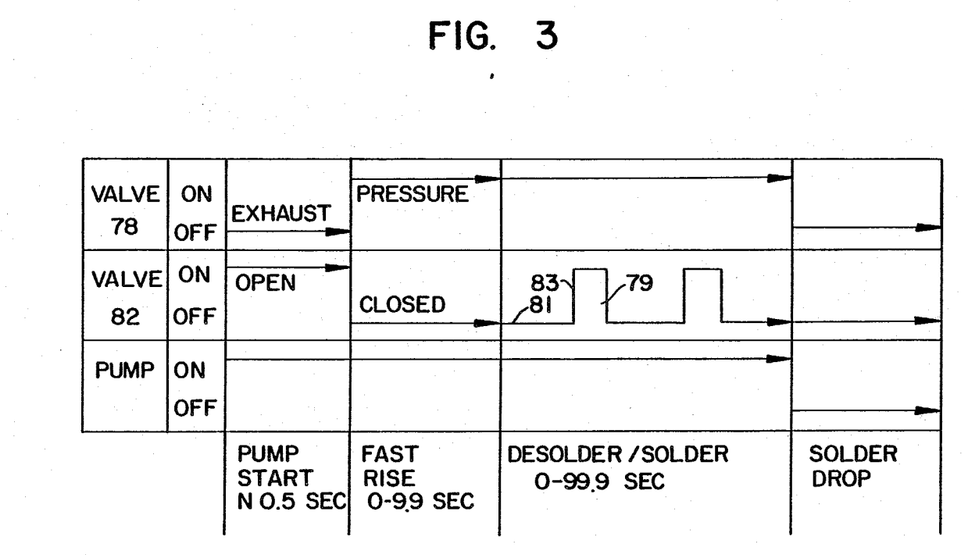
FIG. 3 is a timing diagram illustrating various cycles of operation of the apparatus of FIG. 1 under the control of the pressurized air source of FIG. 2.

After the fast rise time has elapsed, the outputs from pressurized air controller 84 are again changed such that, as indicated in FIG. 3, solenoid valve 82 has applied thereto a pulse train where the ON time of the pulse typically is constant at 50 milliseconds while the OFF time may be adjusted between about 0 and 99.9 milliseconds. Of course, these times are illustrative and may be varied within the scope of the invention. The output signals applied to solenoid valve 78 and pump 72 remain unchanged during this cycle. The length of this cycle may vary from 0 to 99.9 seconds where again these values are preferred but not intended to be limitative. At the beginning of the cycle switch 82 is turned OFF for a preset period of time within the 0 to 99.9 millisecond range mentioned above. Since valve 82 is closed and valve 78 is in its first position, pressurized air is supplied to reservoir 12 for the preset time interval which may be 75 milliseconds, for example.

After the 75 milliseconds have elapsed, the valve 82 has a 50 millisecond pulse applied thereto to open the valve and thus exhaust the air from pump 72 to the atmosphere although some air is also applied to reservoir 12 since valve 78 remains in its first position during this time. However, most of the air passes through by valve 82 and thus the pressurized air from pump 72 is effectively removed from reservoir 12 for the 50 millisecond duration of the ON pulse.

In the foregoing manner, normally closed valve 82 is pulsed ON and OFF to open and close it and thus apply an effective pressure to the solder in the reservoir, the effective pressure being a direct function of the ratio of the OFF time to the ON time of solenoid valve 82. The longer the OFF time, the greater the effective pressure and thus the higher the level the solder is raised to and maintained at in nozzle 10. The ratio of OFF time to ON time of solenoid valve 82 is a function of the nozzle size as is the fast rise time discussed above. As will be described below, this ratio can be calibrated to correspond to different nozzle sizes and thus the operator can immediately select the desired ratio depending upon the nozzle size employed.

From the foregoing, it can be seen that the pulsing of solenoid valve 82 effects a slower, controlled rise of the solder in nozzle 10 to its final, intended level. Thus, as stated above, the solder is quickly brought up to about 99 percent, for example, of its intended final level during the fast rise cycle. Of course, the solder cannot be brought up to its final intended level by the constant application of pressure as is the case during the fast rise cycle since the solder will invariably over shoot the final level due to the momentum thereof. This is a particularly significant concern when the final intended level corresponds to the uppermost level of nozzle 10. Any over shoot will result in overflow of the solder from the nozzle into cup 64. This is undesirable in that it is wasteful of the solder. Hence, by pulsing the pressure, it can be brought to a level even at the uppermost level of the nozzle without overflow of the solder.

Moreover, another advantage of pulsing the solder is that ripples or waves are created at the upper surface of the solder and this results in desired agitation of the joints being soldered or desoldered to thus enhance the soldering/desoldering operation. A further advantage of applying pulses of air to the solder as opposed to a constant application of pressurized air is that the air is heated by the solder and thus expands. This expansion will change the level of the solder in the nozzle. Since the solder level in the nozzle should be maintained as accurately as possible, application of pulses of the pressurized air more accurately achieves this goal.

As shown in FIG. 3, the length of the desolder/solder operation may typically vary from 0 to 99.9 seconds. This time is about 30 seconds for many procedures. Only about two cycles of the ON and OFF pulse train applied to solenoid valve 82 are shown in FIG. 3. This is done for purposes of illustration. Of course, in practice, a large number of these cycles will occur during the desolder/solder operating cycle. The length of the cycle is mainly determined by the procedure to be performed and is under operator control as will be described with respect to FIG. 4.

At the end of the desolder/solder operating cycle, the output of pressurized air controller 84 again changes. Thus, as can be seen in FIG. 3, pump 72 is turned OFF as are solenoid valves 80 and 82. Thus, the solder in the system of FIG. 1 is allowed to return to its level shown in FIG. 1. As stated above, the rate of return is controlled by flow control valve 82 to ensure the integrity of soldered joints.

Figure 4:
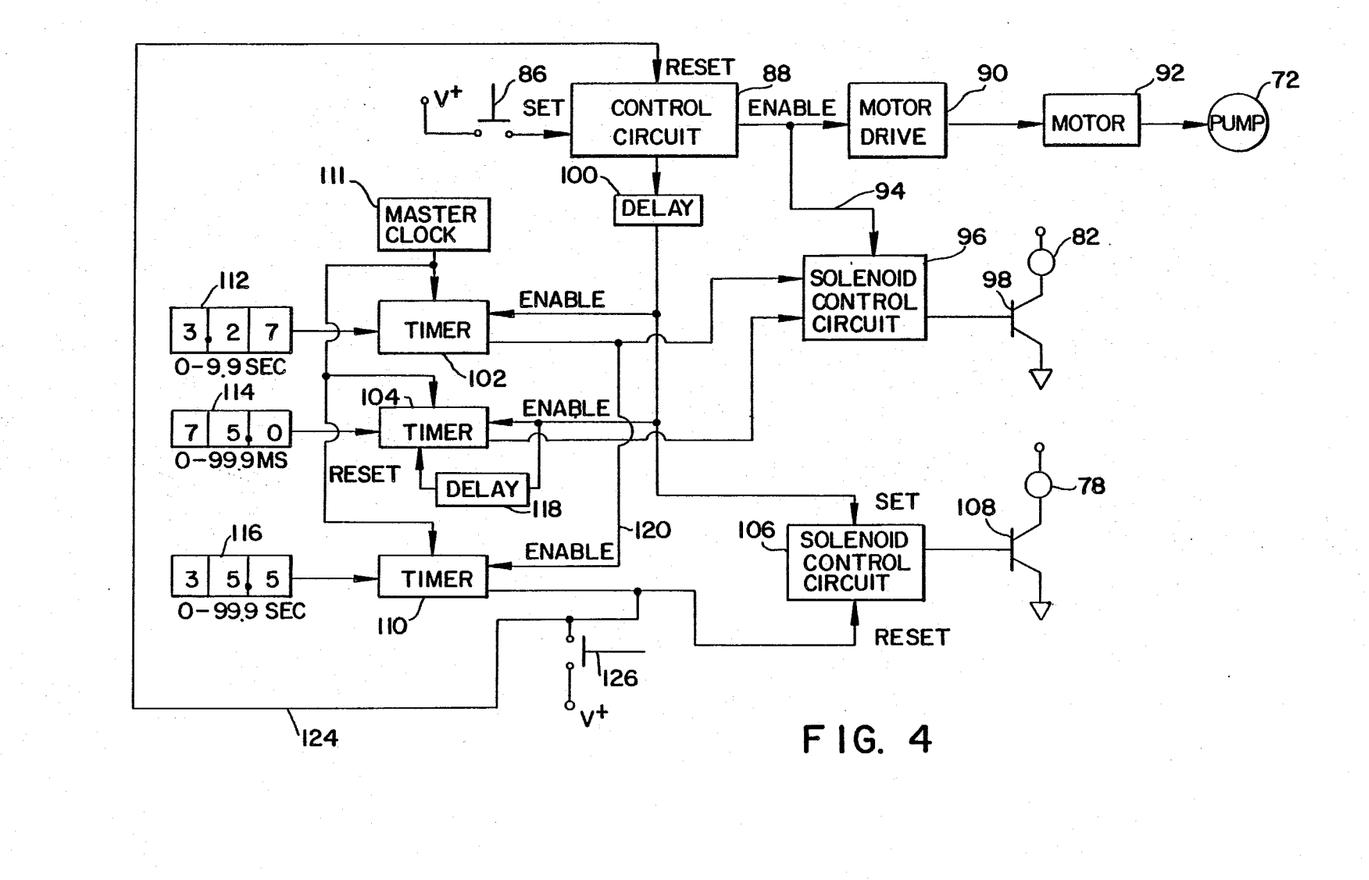
FIG. 4 is a block diagram of an illustrative pressurized air controller for use in the pressurized air source of FIG. 2.

Referring to FIG. 4, there is shown an illustrative block diagram of pressurized air controller 84 of FIG. 2. The controller includes a start switch 86 which initiates the various cycles of operation illustrated in FIG. 3. The start switch connects a voltage source V+ to a control circuit 88. The control circuit comprises a flip-flop. Thus, in particular, the start switch 86, when actuated, connects the V+ voltage to the SET input of the flip-flop to cause the SET output thereof to go high. The SET output is applied as an ENABLE signal to a motor drive 90, which in turn controls a pump motor 92 which drives pump 72 of FIG. 2. The SET output is also applied over line 94 to one input of a solenoid control circuit 96, the control circuit comprising a three-input AND gate. The output of the AND gate is applied to the base of an NPN transistor 98, the emitter of which is connected to ground and the collector of which is connected to the V+ voltage source via solenoid 82 of FIG. 2. The SET output of the flip-flop is also connected to a delay circuit 100, the length of the delay corresponding to the length of the pump start cycle of FIG. 3. Thus, this delay is approximately 0.5 second. In general, the delay should be sufficient to allow pump 72 to reach its rated pumping speed. The output of delay 100 is applied as an ENABLE signal to a timer 102 and to a timer 104. The output of delay 100 is also applied to a solenoid control circuit 106, the latter circuit being a flip-flop where the output from delay 100 is applied to the SET input of the flip-flop. The SET output of the flip-flop is applied to the base of a transistor 108, the emitter of which is connected to ground and the collector of which is connected to the V+ voltage source through three-way solenoid valve 78 of FIG. 2. A master clock 110, which typically runs at about 1 MHz, is applied to timers 102 and 104 and a further timer 110. Timers 102, 104, and 110 are commercially available from Intersil Inc. as Part Number ICM 7250. Respectively connected to the above timers are thumbnail switches 112 through 116, these switches being commercially available from the Cherry Switch Company as Part Number T65-02. Connected to the output of timer 104 is a delay circuit, the length of the delay corresponding to the fixed length of the ON pulses (typically 50 milliseconds) applied to solenoid 78 and illustrated at 79 in FIG. 3. This delay circuit may include means for varying the length of the ON pulse where the amount of delay would be adjustable under operator control by means not shown. The output of delay 118 is connected to a reset input of timer 104.

The output of timer 102 is connected to one of the inputs of the three-input AND gate comprising control circuit 96. The output of timer 102 is also connected over line 120 to the ENABLE input of timer 110.

The output of timer 104 is connected to the third input of the three-input AND gate comprising control circuit 96. The output of timer 110 is connected to the RESET input of the flip-flop comprising control circuit 106. Also connected to the output of timer 110 is a reset line 124 which is connected to the RESET input of the flip-flop comprising control circuit 88. Application of the reset voltage to control circuit 88 resets all circuits comprising pressurized air controller 84. A stop switch indicated at 126 is connected between line 124 and the V+ voltage source and provides an emergency capability of shutting down the system of FIG. 1 whenever this switch is actuated.

In operation, switch 86 is closed to SET control circuit 88 and thus apply an ENABLE signal to motor drive 90. The drive circuit thus actuates motor 92 to drive pump 72. The closure of switch 86 initiates the pump start cycle of FIG. 3. The SET output of control circuit 88 is also applied as a high level signal to the three-input AND gate comprising solenoid control circuit 96. Prior to enablement thereof, timers 102 and 104 have their respective outputs at the high level. Thus, all three inputs of the AND gate 96 are at the high level when the SET signal from control circuit 88 is applied over line 94 to the gate. Accordingly, the base of transistor 98 is raised to close the circuit including solenoid 82. Hence, the solenoid is turned ON (or opened), as indicated in the pump start cycle of FIG. 3. Solenoid valve 78 will be OFF (that is, in its second position) at this time and since no action is taken during the pump start cycle to switch this valve, it remains OFF to thus permit the pump 72 to reach its rated pump speed during the pump start cycle of FIG. 3.

As stated above, the pumps start cycle is timed by delay 100, the length of this delay being about 0.5 seconds. At the end of this time, an ENABLE signal is applied to timers 102 and 104 and the flip-flop comprising solenoid control circuit 106 is SET. The setting of control circuit 106 closes the circuit through solenoid valve 78 to turn it ON and thus place it in its first position whereby it connects pump 72 to solder reservoir 12. This is shown in FIG. 3 for the fast rise cycle.

As stated above, valve 82 is open during the pump start cycle and is returned to its normally closed position at the beginning of the fast rise cycle. This is effected by applying the ENABLE output from delay 100 to timer 102. The normally high output of timer 102 is thus switched to a low output to thus de-activate the AND gate of control circuit 96 and switch the output thereof to a low level which turns off the transistor 98 and, accordingly, turns off solenoid 82 to return it to its normally closed position, as indicated in FIG. 3. The duration of the fast rise cycle is determined by the setting placed in thumbnail switch 112 by the operator. In the embodiment of FIG. 4 a fast rise time of 3.2 seconds is chosen. It should be noted that although the thumbnail switches are illustrated as giving three place accuracy, two place accuracy may be appropriate in many applications. Of course, the number of places of accuracy can be varied dpending upon the application. The output of the thumbnail switch 112 is an analog signal which is applied to timer 102, the magnitude of the analog signal corresponding to the setting of the switch and determining the number of clock pulses from source 110 which will be counted before the output of timer 102 is switched back to its normally high level. As stated above, the output of timer 102 is switched from its normally high level to a low level upon application of the ENABLE signal to the timer. The enable signal also effects counting of the clock pulses until the number thereof counted corresponds to the number set in thumbnail switch 112. At this time, the output of timer 102 will be switched back to its high level to again enable the AND gate of circuit 96. In particular, at this time, the fast rise cycle will be completed and the solder in FIG. 1 will have been raised to a level which is about 99 percent, for example, of its final intended level at the uppermost level of nozzle 10.

In order to raise the solder to its final level in a controlled manner, the output of timer 104 is now utilized. Timer 104 is enabled at the same time timer 102 is enabled. Thus, its normally high output is immediately switched to a low output and then a time interval corresponding to the time set in thumbnail switch 114 is timed in a manner similar to that described above for timer 102. However, the time set in thumbnail switch 114 is much shorter than that set in switch 112. In particular, in FIG. 4, a time of 75 milliseconds is set into thumbnail switch 114. This time corresponds to the OFF time 81 shown in the desolder/solder cycle of FIG. 3. Thus, when a number of pulses from clock source 110 are counted corresponding to the 75 millisecond time interval, the output of timer 104 will switch back to its high level as indicated at 83 in FIG. 3. The positive transition 83 is also applied to a delay circuit or line 118, the delay of which is typically fixed at a predetermined value such as 50 milliseconds. Once this period of time has elapsed, a RESET signal is applied to timer 104 from the output of delay 118 whereby the output of the timer is again switched to its low level and the timing function described above is again repeated to generate an OFF time interval corresponding to the 75 millisecond value set in thumbnail switch 114. The foregoing generation of 75 millisecond OFF time intervals and 50 millisecond ON time intervals is continued as long as the ENABLE signal is applied to timer 104.

At this time it should be appreciated that the foregoing pulse train is not applied to solenoid valve 82 during the fast rise time cycle. That is, as described above, during the fast rise time cycle, the output of timer 102 is low and thus none of the pulses generated by timer 104 are passed by the AND gate of circuit 96. However, at the end of the fast rise cycle, the output of timer 102 returns to its high level which thus permits the AND gate 96 to pass the pulses generated by timer 104. Two of the pulses thus passed by the AND gate are illustrated in the desolder/solder cycle of FIG. 3. As stated above, each time a positive pulse is passed by the AND gate, solenoid valve 82 is opened to thus effectively prevent the application of pressure to solder reservoir 12. Thus, during the 75 millisecond low level intervals of the output from timer 104, solenoid valve 82 is not actuated and is thus closed thereby permitting direct flow of air from pump 72 through solenoid valve 78 to the solder reservoir. The height the solder will rise in nozzle 10 is a direct function of the number placed in thumbnail switch 114. The larger this number, the higher the solder will rise. Hence, the height the solder does rise in nozzle 10 can be accurately set by appropriately controlling thumbnail switch 114.

As described above, it is typical to raise the solder in nozzle 10 to its uppermost level to thus facilitate good contact between the printed circuit board disposed on or above the nozzle. As discussed above, there are times when dross may accumulate at the upper surface of the nozzle and this can be removed by slightly overflowing the dross containing solder over the edges of the nozzle into cup 64. For example, if the setting 75 of FIG. 4 corresponds to the solder rising to the uppermost level of the nozzle for the amount of solder employed in the system of FIG. 1, dross-containing solder may be overflowed from the nozzle by changing the setting of switch 114 to 77, for example. The thumbnail switch can then be left at 77 and the solder will again arise to the uppermost level of nozzle 10 preparatory to the next operation. That is, by overflowing some of the solder, the amount of solder in the system of FIG. 1 is reduced since the overflowed solder is not returned to the system solder. Hence, a slightly greater pressure is now needed to raise the solder to the uppermost level of nozzle 10. The new setting of 77 in thumbnail switch 114 will accomplish this. Thus, once the setting of switch 114 is such that the solder will reach the uppermost level of nozzle 10, the solder can be repeatedly raised to this level with a high degree of accuracy.

As indicated in FIG. 3, the solder/desolder time is held for a predetermined period of time which may vary from 0 to 99.9 seconds, the length of this time primarily depending upon the job to be performed. In the embodiment of FIG. 4, this time is chosen as 35.5 seconds. Thumbnail switch 116 applies an analog value corresponding to this time to timer 110. Timer 110 functions in the same way as described above with respect to timer 102 to time a predetermined interval by counting the clock pulses from clock source 110 for a length of time corresponding to the magnitude of the analog output from thumbnail switch 116. As can be seen from FIG. 3, the desolder/solder cycle commences immediately after the fast rise cycle. Hence, since timer 102 controls the duration of the fast rise cycle, the output thereof is utilized to apply an ENABLE signal over line 120 where the positive going transition which occurs at the output of timer 102 at the end of the fast rise cycle will enable timer 110 to switch its normally high output to the low level thereof. This low level will be maintained for the length of time set in thumbnail switch 116 in the manner described above for the other timers. The output of the timer will then switch high and be applied as a reset for the flip-flop comprising control circuit 106. This will end the desolder/solder cycle and commence the solder drop cycle of FIG. 3.

In particular, the resetting of flip-flop 106 returns solenoid valve 78 to its second position where it exhausts the solder reservoir to the atmosphere through flow control valve 80. At the same time, the transition to the high level at the output of timer 110 is applied to the reset input of the flip-flop comprising control circuit 88 over line 124. When the flip-flop is reset, the ENABLE signal applied over line 94 to the AND gate comprising circuit 96 is changed from its high level to its low level thus turning off (and thus closing) solenoid valve 82, as indicated in the solder drop cycle of FIG. 3. Moreover, the enable SIGNAL is removed from motor drive 90 thus turning off pump 72, as also indicated in the solder drop cycle of FIG. 3. Hence, a complete cycle for soldering or desoldering has now been described under the control of pressurized air controller 84. Of course, as stated above, operations other than soldering or desoldering can also be implemented.

In case there is a need to stop the operation for an emergency or any other reason, stop button 126 may be closed to connect the V+ source to the reset terminals of the flip-flops comprising control circuits 88 and 106 and the solder drop cycle will immediately commence.

Certain variations of the system as described above are possible such as implementation of the function of pressurized air controller 84 by a software controlled microprocessor, the software being responsive to the settings of the thumbnail switches 112 through 116 or other appropriate in put devices to control solenoid valves 78 and 82 and pump 72 in accordance with the timing diagram of FIG. 3. Moreover, for certain functions, a mechanical pump such as pump 72 need not be utilized and, in fact, a hand pump can be connected to inlet 83 of reservoir 12. Moreover, the circuitry of FIG. 4 has been described in connection with automatic operation of the system; however, manual operation of the various cycles of the system can also be readily implemented by those having ordinary skill in this art.

Figure 5:
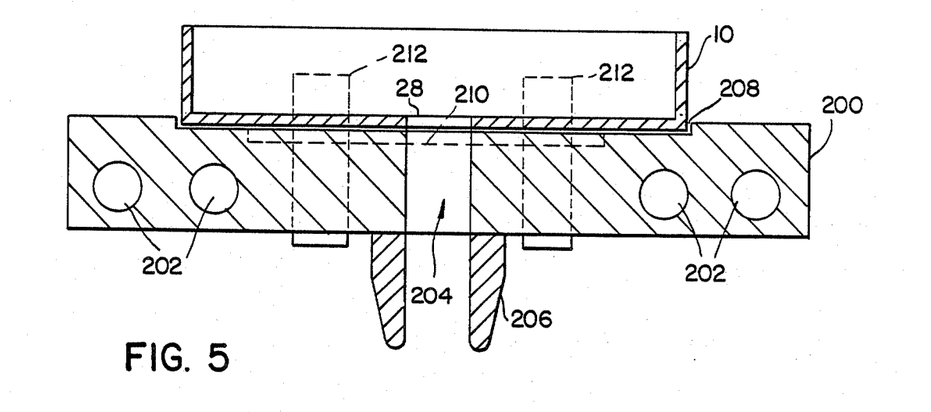
FIG. 5 is a cross-sectional view of an illustrative, auxiliary heating source for use with the system of FIG. 1, for example.

Reference should now be made to FIG. 5 which is a cross sectional view of an auxiliary heater for use with the system of this invention. As stated hereinbefore, certain jobs require nozzles of a very large size, for example, 18 inches long by ¾ inches wide by 0.7 inches deep. In such an instance, the solder transferred into the nozzle may lose its heat to such a degree that the desired operation is compromised. Thus, to provide additional heat to the solder once it reaches the nozzle, various implementations are possible. Thus, in FIG. 1, auxiliary heaters indicated at 85 may be disposed in the nozzle to provide the requisite auxiliary heat where means (not shown) could be provided to isolate the heaters from the solder. Another configuration for providing auxiliary heater is illustrated in cross section in FIG. 5. The auxiliary heater comprises a solid block 200 of a material such as a metal or alloy which will store heat once it has been heated to a temperature such as the solder melt temperature. Disposed within the block are a plurality of heaters 202 which heat the block. An opening 204 extends through the block for the passage of solder, the diameter of the opening being substantially the same as that of opening 28 in nozzle 10. Plug 206 is attached to the bottom of block 200 and corresponds to plug 30 of FIG. 1. Thus, it can be inserted in intermediate plug 34 of FIG. 1 or into tubular portion 36 of cover 39. The upper surface of the block of solid material may be provided with a recess 208 for receiving nozzle 10. Other smaller recesses as indicated by dotted line 210 may be provided within the larger recess 208 to accommodate smaller nozzles. Moreover, detachable clamps indicated at 212 may be provided to clamp the nozzle tightly with respect to the block 208 and thus minimize or prevent the flow of solder between block 200 and the underside of nozzle 10. Clamps 212 are diagrammatically indicated as being attached to the back side of nozzle 10 and engaging the underside of block 200 similar clamps (not shown) would be employed on the forward side of the nozzle. Since clamping means of various types are known, no further description is given with respect to these elements.

Figure 6:
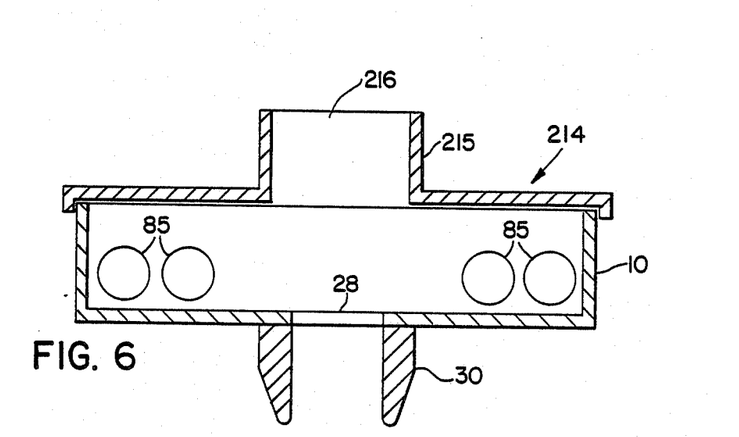
FIG. 6 is a cross-sectional view of another illustrative, auxiliary heating source for use with the system of FIG. 1, for example

Referring to FIG. 6, another embodiment employing an auxiliary heater is illustrated. Here the nozzle 10 corresponds to that of FIG. 1 and incorporated therein are heaters 85 as described above. Additionally, a cap 214 is provided which is mounted over nozzle 10 to completely cover the upper opening thereof. Provided in cap 214 is a further nozzle 215 having an opening 216 which is smaller than the opening of nozzle 10. Thus, the embodiment of FIG. 6 provides another means for providing auxiliary heat to the work, if necessary.

Referring to FIG. 2, there is diagrammatically indicated in dotted lines a diaphragm member generally indicated at 220. This diaphragm member may be inserted in the line between valve 78 and reservoir 12. The diaphragm member is divided into two air tight chambers 222 and 224 by a flexible diaphragm 226. Chamber 222 communicates with the upper surface 56 of the solder in reservoir 12. Chamber 222, the confined space above surface 56, and the pipe connecting the latter space to chamber 222 are filled with an inert gas such as nitrogen.

Chamber 224 communicates with air pump 72 via solenoid valve 78 and needle valve 76. Due to the separation of chambers 222 and 224 from each other by diaphragm 226, there is no mixing of the air in chamber 224 with the inert gas in chamber 222. Hence, no air comes into contact with the upper surface 56 of the solder in reservoir 12. Accordingly, diaphragm member 220 may be employed to further enhance the capability of the system of FIG. 1 to provide a long lasting, substantially contamination-free operation. That is, the inert gas in chamber 222 will not react with the solder and thus the contamination level is lowered from the already low level established by the system of FIG. 1.

In operation, pump 72 exerts air pressure against diaphragm 226. Due to the flexibility of the diaphragm, this pressure is transmitted via the inert gas to the surface 56 of the solder in reservoir 12 to thus raise the solder to a desired level, as discussed above with respect to the FIG. 1 embodiment.

Figure 7:
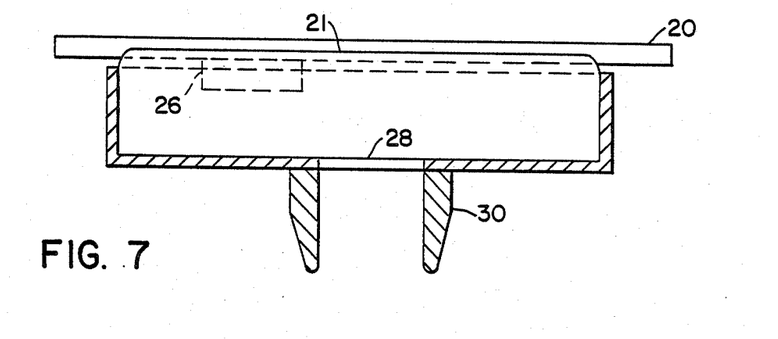
FIG. 7 is a cross-sectional view of a PCB positioned above but not in contact with the nozzle of the present invention.

Referring now to FIG. 7, there is shown a further mode of operation of the system. As shown in FIG. 1, the printed circuit board rests on the upper surface of nozzle 10. Since the walls 62 are thin and comprised of a low thermal conductivity, low thermal mass material, little heat is conducted from the walls to the underside of the board 20. Hence, there is little probability of damage to the board that will be caused by walls 62. In FIG. 7, the board 20 may be slightly spaced from the walls to further minimize the probability of any damage thereto. Slight spacing of the board from the upper edge of nozzle 10 is possible since the solder can actually be raised to a position above the upper edge of the nozzle as indicated at 21. That is, due to the surface tension of the solder, it can be raised to the position shown in FIG. 7 without overflowing from the nozzle. Hence, spacing of the board from the nozzle can be readily implemented and yet effective soldering/desoldering can be achieved. Means for holding the board 20 in a given position with respect to nozzle 10 are disclosed in the related application Ser. No. 763,704 mentioned hereinbefore.

As stated above, surface mounted devices may also be processed by the apparatus of the present invention. That is, the surface mounted device 26 may be simply inserted into the solder as indicated in FIG. 7 for either desoldering a defective component from board 20 or soldering a new component thereto. Since the amount of time the solder is exposed to the work can be accurately controlled in accordance with the present invention, soldering of SMD's to board 20 can be effectively achieved.

It is to be understood that the above detailed description of the various embodiments of the invention is provided by way of example only. Various details of design and construction may be modified without departing from the true spirit and scope of the invention as set forth in the appended claims.

What is claimed is:

1. Apparatus for performing an operation with molten solder, said apparatus comprising
a substantially enclosed molten solder, reservoir, said reservoir including a contained space above the molten solder;
a hollow nozzle for receiving solder from said reservoir;
means for conveying the molten solder in the reservoir to the nozzle;
a source connected to said contained space for introducing a pressurized gas into the space to raise the solder through said conveying means to a predetermined level within said nozzle and maintaining said solder at said predetermined level to thus effect said operation with the molten solder; and
a diaphragm member disposed between said gas source and said contained space, said diaphragm member having first and second chambers separated by a flexible diaphragm where said first chamber is filled with an inert gas and communicates with said solder and said second chamber communicates with said pressurized gas source, the gas of said gas source being air such that when pressurized air is introduced into the first chamber, the pressure thereof is transferred to the inert gas in said second chamber via the flexible diaphragm to thus raise the solder form the container to the predetermined level in the nozzle.

2. Apparatus for performing an operation with molten solder, said apparatus comprising
a container of said molten solder;
a hollow nozzle for receiving solder from said container, said nozzle having an opening in the bottom thereof;
a cover for said container, said cover having an opening therein;
tubular means extending between the opening in the bottom of the nozzle and through the opening in said cover into the solder within the container whereby a container space is established within said container extending between said cover and the upper surface of the solder within the container;
a source connected to said space for introducing a pressurized gas into the container space to raise the solder through said tubular means to a predetermined level within said nozzle and maintaining said solder at said predetermined level to thus effect said operation with the molten solder; and
a diaphragm member disposed between said gas source and said contained space, said diaphragm member having first and second chambers separated by a flexible diaphragm where said first chamber is filled with an inert gas and communicates with said solder and said second chamber communicates with said pressurized gas source, the gas of said gas source being air such that when pressurized air is introduced into the first chamber, the pressure thereof is transferred to the inert gas in said second chamber via the flexible diaphragm to thus raise the solder form the container to the predetermined level in the nozzle.

3. Apparatus for performing an operation with molten solder where said operation comprises desoldering or soldering a component mounted on a substrate, said apparatus comprising
a substantially enclosed molten solder reservoir, said reservoir including a container space above the molten solder;
a hollow nozzle for receiving solder from said reservoir said substrate being disposed above the nozzle;
means for conveying the molten solder in the reservoir to the nozzle;
a source connected to said contained space for introducing a pressurized gas into the space to raise the solder through said conveying means to a predetermined level within said nozzle and maintaining said solder at said predetermined level to thus effect said operation with the molten solder;

where said pressurized gas source includes means for quickly raising the solder in the container to a level below said predetermined level in the nozzle; and where said source of pressurized gas includes (a) means for pulsating the gas introduced in to said contained space and (b) means for operating said means for pulsating the gas in response to the solder being raised to the level below the predetermined level to thus raise the solder to the predetermined level at a rate of speed which is less than the rate of speed at which the solder was raised to the level below the predetermined level.

4. Apparatus for performing an operation with molten solder where said operation comprises desoldering or soldering a component mounted on a substrate, said apparatus comprising a container of said molten solder;

a hollow nozzle for receiving solder from said container, said nozzle having an opening in the bottom thereof said substrate being disposed above the nozzle;

a cover for said container, said cover having an opening therein;

tubular means extending between the opening in the bottom of the nozzle and through the opening in the said cover into the solder within the container whereby a contained space is established within said container extending between said cover and the upper surface of the solder within the container;

a source connected to said space for introducing a pressurized gas into the contained space to raise the solder through said tubular means to a predetermined level within said nozzle and maintaining said solder at said predetermined level to thus effect said operation with the molten solder; and where said pressurized gas source includes means for quickly raising the solder in the container to a level below said predetermined level in the nozzle; and where said source of pressurized gas includes (a) means for pulsating the gas introduced in to said contained space and (b) means for operating said means for pulsating the gas in response to the solder being rasied to the level below the predetermined level to thus raise the solder to the predetermined level at a rate of speed which is less than the rate of speed at which the solder was raised to the level below the predetermined level.

5. A method of performing an operation with molten solder where said operation comprises desoldering or soldering a component mounted on a substrate where the solder is normally contained in a reservoir and is conveyed to a nozzle to effect said operation, the method comprising the steps of applying pressurized gas to the molten solder in the reservoir to quickly raise it to a level below a predetermined level in the nozzle, said predetermined level being approximately at the uppermost level of the nozzle; and pulsating the pressurized gas, said pulsation of the gas occurring after the solder has been quickly raised to the level below the predetermined level to thus raise the solder to the predetermined level at a rate of speed which is less than the rate of speed at which the solder was raised to the level below the predetermined level.

6. Apparatus for performing an operation with molten solder, and said apparatus comprising said molten solder;

a container of said molten solder;

a hollow nozzle for receiving solder from said container, said nozzle having an opening in the bottom thereof;

a cover for said container, said cover having an opening therein;

tubular means extending between the opening in the bottom of the nozzle and through the opening in the said cover into the solder within the container whereby a container space is established within said container extending between said cover and the upper surface of the solder within the container; and a source connected to said space for introducing a pressurized gas into the contained space to raise the solder through said tube to a predetermined level within said nozzle where said predetermined level is approximately at the uppermost level of the nozzle and maintaining said solder at said predetermined level to thus effect said operation with the molten solder; and where said tubular means includes a tubular plug attached to the bottom of said nozzle where the opening extending through the tubular plug is substantially aligned with the opening in the bottom of the nozzle; and where the exterior surface of said tubular plug is downwardly tapered.

7. Apparatus as in claim 6 wherein said tubular means includes a tubular member, the inner surface of which is tapered to receive the tapered poriton of said tubular plug to thus form an hermetic seal therebetween.

8. Apparatus as in claim 7 where said tubular means includes a tubular portion depending downwardly from said cover where the opening in the tubular portion is substantially aligned with the opening in the cover.

9. Apparatus as in claim 8 where the outer surface of said tubular member is tapered downwardly and where the inner surface of said tubular portion is tapered downwardly to receive the tapered outer portion of said tubular member and thus effect an hermetic seal therebetween.

10. Apparatus for performing an operation with molten solder, said apparatus comprising said molten solder;

a container of said molten solder;

a hollow nozzle for receiving solder from said container, said nozzle having an opening in the bottom thereof;

a cover for said container, said cover having an opening therein;

tubular means extending between the opening in the bottom of the nozzle and through the opening in the said cover into the solder within the container whereby a contained space is established within said container extending between said cover and the upper surface of the solder within the container; and a source connected to said space for introducing a pressurized gas into the contained space to raise the solder through said tube to a predetermined level within said nozzle where said predetermined level is approximately at the uppermost level of the nozzle and maintaining said solder at said predetermined level to thus effect said operation with the molten solder; and where said cover slopes downwardly from the periphery of the container to form a cup for any molten solder which may overflow from said nozzle.

11. Apparatus as in claim 10 where a groove is formed in the lower portion of said cup to catch any of said overflow solder and thus prevent its return to the solder in the container.

12. Apparatus for performing an operation with molten solder, said apparatus comprising said molten solder;

a container of said molten solder;

a hollow nozzle for receiving solder from said container, said nozzle having an opening in the bottom thereof;

a cover for said container, said cover having an opening therein;

tubular means extending between the opening in the bottom of the nozzle and through the opening in the said cover into the solder within the container whereby a contained space is established within said container extending between said cover and the upper surface of the solder within the container; and a source connected to said space for introducing a pressurized gas into the contained space to raise the solder through said tube to a predetermined level within said nozzle where said predetermined level is approximately at the uppermost level of the nozzle and maintaining said solder at said predetermined level to thus effect said operation with the molten solder; and including an auxiliary heating means disposed between said tubular means and said nozzle, said auxiliary heating means including a solid block of high thermal capacity material having an opening extending therethrough, means for supporting said nozzle on said block so that the opening in the bottom of the nozzle is in substantial alignment with the opening through the block, at least one heating means disposed in the block for heating the block to a predetermined temperature, and means for connecting the block to said tubular means.

13. Apparatus as in claim 12 where said block includes at least one recessed portion on the upper surface thereof for receiving said nozzle.

14. Apparatus as in claim 12 including means for detachably clamping said nozzle to said block to minimize the space between the lower surface of the nozzle and the upper surface of the block.

15. Apparatus for performing an operation on a workpiece with molten solder, said apparatus comprising said molten solder;

a substantially enclosed molten solder reservoir including a contained space above the molten solder;

a hollow nozzle for receiving solder from said reservoir;

tubular means for conveying the molten solder in the reservoir to the nozzle; and a source connected to said contained space for introducing a pressurized gas into the space to raise the solder through said conveying means to a predetermined level within said nozzle wherein said predetermined level is approximately at the uppermost level of the nozzle and maintaining said solder at said predetermined level to thus effect said operation with the molten solder; and where said operation comprises desoldering or soldering a component mounted on a substrate, said substrate being disposed above the nozzle; and where said source of pressurized gas includes means for pulsating the gas introduced into said contained space.

16. Apparatus for performing an operation with molten solder, said apparatus comprising said molten solder;

a container of said molten solder;

a hollow nozzle for receiving solder from said container, said nozzle having an opening in the bottom thereof;

a cover for said container, said cover having an opening therein;

tubular means extending between the opening in the bottom of the nozzle and through the opening in the said cover into the solder within the container whereby a contained space is established within said container extending between said cover and the upper surface of the solder within the container; and a source connected to said space for introducing a pressurized gas into the contained space to raise the solder through said tube to a predetermined level within said nozzle where said predetermined level is approximately at the uppermost level of the nozzle and maintaining said solder at said predetermined level to thus effect said operation with the molten solder; and where said operation comprises desoldering or soldering a component mounted on a substrate, said substrate being disposed above the nozzle; and where said source of pressurized gas includes means for pulsating the gas introduced into said contained space.

17. Apparatus as in claim 15 or 16 where said pulsation of the gas causes ripples on the surface of the solder at said predetermined level.

18. Apparatus as in claim 17 including means for controlling the duration of each pulsation of the gas.

19. Apparatus as in claim 18 including means for controlling the length of time between each pulsation of the gas.

20. Apparatus as in claims 15 or 16 including means for controlling the length of time the gas is pulsed.

21. Apparatus as in claim 20 including means for returning said solder to said solder container in response to the cessation of pulsation of the gas.

22. Apparatus for performing an operation on a workpiece with molten solder, said apparatus comprising said molten solder;

a substantially enclosed molten solder reservoir including a contained space above the molten solder;

a hollow nozzle for receiving solder from said reservoir;

tubular means for conveying the molten solder in the reservoir to the nozzle; and a source connected to said contained space for introducing a pressurized gas into the space to raise the solder through said conveying means to a predetermined level within said nozzle wherein said predetermined level is approximately at the uppermost level of the nozzle and maintaining said solder at said predetermined level to thus effect said operation with the molten solder; and where said operation comprises desoldering or soldering a component mounted on a substrate, said substrate being disposed above the nozzle; and where said pressurized gas source includes means for connectng said space to the atmosphere to allow the solder at the predetermined level in the nozzle to return to said container; and including means for controlling the flow rate of the gas to the atmosphere to thus control the rate at which the solder leaves the predetermined level.

23. Apparatus for performing an operation with molten solder, said apparatus comprising said molten solder;

a container of said molten solder;

a hollow nozzle for receiving solder from said container, said nozzle having an opening in the bottom thereof;

a cover or said container, said cover having an opening therein;

tubular means extending between the opening in the bottom of the nozzle and through the opening in the said cover into the solder within the container whereby a contained space is established within said container extending between said cover and the upper surface of the solder within the container; and a source connected to said space for introducing a pressurized gas into the contained space to raise the solder through said tube to a predetermined level within said nozzle where said predetermined level is approximately at the uppermost level of the nozzle and maintaining said solder at said predetermined level to thus effect said operation with the molten solder; and where said operation comprises desoldering or soldering a component mounted on a substrate, said substrate being disposed above the nozzle; and where said pressurized gas source includes means for connecting said space to the atmosphere to allow the solder at the predetermined level in the nozzle to return to said container; and including means for controlling the flow rate of the gas to the atmosphere to thus control the rate at which the solder leaves the predetermined level.

24. A method of performing an operation with molten solder where the solder is normally contained in a reservoir and is conveyed to a nozzle to effect said operation, the method comprising the steps of applying pressurized gas to the molten solder in the reservoir to convey it to a predetermined level in the nozzle, said predetermined level being approximately at the uppermost level of the nozzle; and where said operation comprises desoldering or soldering a component mounted on a substrate, said substrate being disposed above the nozzle; and including pulsating the pressurized gas.

25. A method as in claim 24 where said pulsation of the gas causes ripples on the surface of the solder at said predetermined level.

26. A method as in claim 24 including controlling the duration of each pulsation of the gas.

27. A method as in claim 26 including controlling the length of time between each pulsation of the gas.

28. A method as in claim 24 including controlling the length of time the gas is pulsed.

29. A method as in claim 28 including returning said solder to said reservoir in response to the cessation of pulsation of the gas.

30. A method as in claim 24 including allowing the solder at the predetermined level in the nozzle to return to said container.

31. A method as in claim 30 including controlling the rate at which the solder leaves the predetermined level.

* * * * *